(12) United States Patent
Oberg et al.

(10) Patent No.: US 7,372,924 B1
(45) Date of Patent: May 13, 2008

(54) METHOD AND SYSTEM TO IMPROVE DECISION-DRIVEN CONTROL LOOPS

(75) Inventors: Mats Oberg, Cupertino, CA (US);
Runsheng He, Sunnyvale, CA (US);
Michael Madden, Mountain View, CA (US)

(73) Assignee: Marvell International Limited, Hamilton (BM)

( * ) Notice: Subject to any disclaimer, the term of this patent is extended or adjusted under 35 U.S.C. 154(b) by 762 days.

(21) Appl. No.: 10/797,254

(22) Filed: Mar. 10, 2004

Related U.S. Application Data

(60) Provisional application No. 60/513,688, filed on Oct. 22, 2003.

(51) Int. Cl.
*H04L 27/08* (2006.01)
(52) U.S. Cl. .................. 375/345; 375/265; 714/795
(58) Field of Classification Search ............... 375/345, 375/265; 714/795
See application file for complete search history.

(56) References Cited

U.S. PATENT DOCUMENTS 6,246,723 B1 * 6/2001 Bliss et al. ................. 375/265
7,107,514 B1 * 9/2006 Oberg et al. ................ 714/795
7,213,196 B2 * 5/2007 Allen et al. ................. 714/795

OTHER PUBLICATIONS

Boyle, "A catastrophic error mode in adaptive predictive DIR equalisation of dynamic channels" 2001 IEEE Workshop on Signal Processing Systems, Sep. 26-28, 2001 pp. 177-184.*

* cited by examiner

*Primary Examiner*—Mohammed Ghayour
*Assistant Examiner*—Juan Alberto Torres

(57) ABSTRACT

A decision-driven control loop wherein a first reconstructed signal is compared to an unreconstructed data symbol signal to initially drive the control loop. A second reconstructed signal that is based on a longer memory path than the first reconstructed signal is evaluated against the first reconstructed signal. The decision-driven control loop is ultimately controlled based on the results of the evaluation between the first and second reconstructed signals. The inventive decision-driven control loop, which may be implemented in software, may form part of a read channel in a storage device.

116 Claims, 11 Drawing Sheets

METHOD AND SYSTEM TO IMPROVE DECISION-DRIVEN CONTROL LOOPS

CROSS REFERENCE

This invention claims priority to Provisional Application No. 60/513,688, filed Oct. 22, 2003.

FIELD OF THE INVENTION

This invention relates to a decision-driven control loop that can be used to transfer information or to control a process. For example, the decision-driven control loop may be used to transfer information from a magnetic or digital medium to an output, in either of a wired or wireless circuit. Additionally, the decision-driven control loop may be used to control a process, for example, a process controlled by a programmable logic controller.

BACKGROUND OF THE INVENTION

One of the advancements of modern technology is the decision-driven control loop ("DDCL"), in which input symbols are fed to a detector and the detector produces an output based on the input symbols. The DDCL includes a feedback loop, wherein the input symbols (prior to being fed to the detector) and the detector's output are evaluated against each other. The result of this evaluation is generally referred to as a decision, and it is this decision that is then used to drive the control loop.

DDCLs are useful in many communication devices requiring a high degree of precision and/or flexibility of decision. For instance, in a circuit for a read channel used for magnetic recording, a DDCL is useful, e.g., for adjusting gain, timing, adaptive finite impulse response (FIR), and/or baseline levels.

Selection of memory path length for a data detector (such as a Viterbi detector) used in a DDCL has an effect on DDCL performance. The data detector tends to be more accurate if a longer memory path is used to derive the detector's output. The longer the memory path, however, the greater the delay, or latency, between the input symbols and the detector output. Accordingly, problems arise in the conflict between the competing needs of accuracy and speed.

SUMMARY OF THE INVENTION

Accordingly, it is a general object of the present invention to provide an improved decision-driven control loop ("ID-DCL") which overcomes the disadvantages described above and other disadvantages of the prior art.

It is additionally a general object of the invention to provide a decision-driven control loop including a data detector producing first and second early decision outputs, and processing circuitry receiving the first and second early decision outputs and providing an output to drive the decision-driven control loop.

The decision-driven control loop will function in a layer system such as a read channel. Some or all of the functionality of the decision-driven control loop may be implemented in software.

BRIEF DESCRIPTION OF THE DRAWINGS

The invention may be further understood by reference to the drawings that include FIGS. 1-10, taken in connection with the following descriptions.

DETAILED DESCRIPTION OF EMBODIMENTS

The following description of illustrative non-limiting embodiments of the invention discloses specific configurations and components. However, the embodiments are merely examples of the present invention, and thus, the specific features described below are merely used to describe such embodiments and to provide an overall understanding of the present invention. Accordingly, one skilled in the art will readily recognize that the present invention is not limited to the specific embodiments described below. Furthermore, the descriptions of various configurations and components of the present invention that are known to one skilled in the art are omitted for the sake of clarity and brevity. Also, throughout this document, the term "noise" is understood by a skilled artisan to be synonymous with "error."

Figure 1:
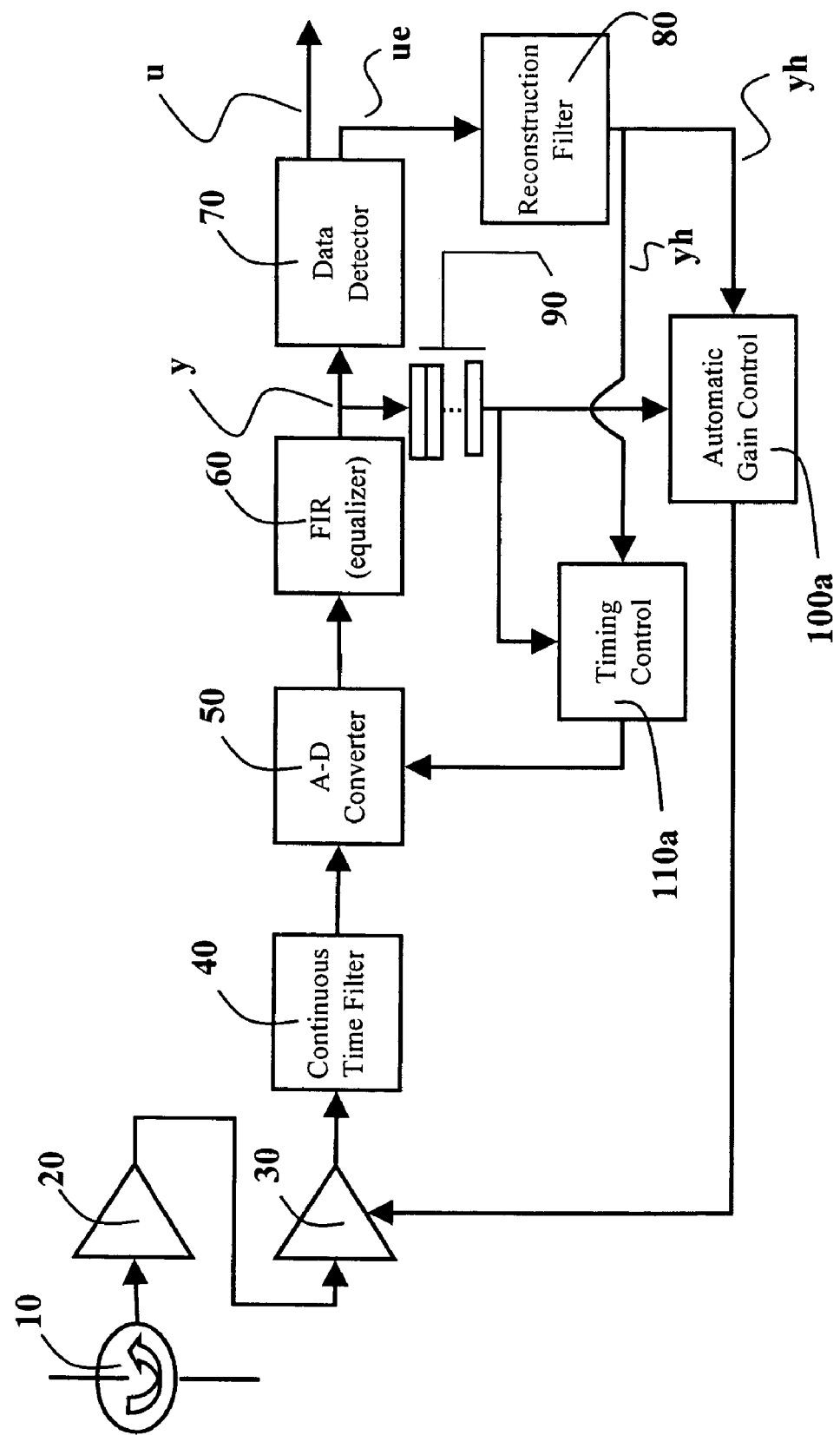
FIG. 1 is an illustration of data channel circuitry for processing signals derived from a storage medium, including examples of decision-driven control loop (DDCL) circuits.

FIG. 1 is an illustration of a known DDCL. As shown in the figure, a drive read head 10 is provided as an initial mediator between the DDCL circuit and information that is magnetically stored on a recording medium. One skilled in the art readily recognizes that the drive read head 10 and the associated magnetic storage medium (and thus the entire DDCL) could just as easily pertain to the reading of an optical storage medium, a magneto-optical storage medium, a digital drive, static or erasable memory, or any other circuit or device in which there is a transfer of information from one circuit to another circuit, or from a part of a circuit to another part of the same circuit, or from one device to another device, through wired, wireless, analog and/or digital means; or to control a process.

The information read by the drive read head 10 is sent to the preamplifier 20. The preamplifier 20 detects and strengthens any weak signals received, for a subsequent, more powerful amplification stage which occurs in the variable gain amplifier (VGA) 30. VGA 30 takes as inputs both the signal from preamplifier 20 and a varying input voltage. The varying input voltage is understood by one skilled in the art to vary the output of the VGA, and the varying input voltage is further described herein in relation to the automatic gain control circuit 100*a*.

The amplified signal from variable gain amplifier 30 is fed to continuous time filter 40. Continuous time filter 40 may be any type of known filter, for example, a Butterworth filter or an elliptic filter. Continuous time filter 40 is meant to filter any type of unwanted feedback or known noise, such as electro-magnetic interference (e.g., the filtering of a 60 Hz "hum" that is common near electrical outlets/wiring).

The output of the continuous time filter 40 is then fed to the analog-to-digital converter (A-D converter) 50, where the information signal is converted from analog to digital format and the timing of the signal is mediated by an additional input from timing control circuit 110*a*.

The output of the A-D converter 50 is fed to a channel-shortening filter 60, otherwise known as a time-domain equalizer. In the example shown in FIG. 1, the time-domain equalizer 60 is a finite impulse response (FIR) filter, and one skilled in the art understands that the purpose of the time-domain equalizer 60 is to correct for known noise effects such as inter-symbol interference (ISI), near-end cross-talk, analog-to-digital quantification errors, and digital noise introduced by finite precision arithmetic.

Despite the use of the aforementioned continuous time filter 40 and equalizer 60, however, the output signal "y" of equalizer 60 may still contain elements of the above-described noise included with the data symbols within the signal. The "y" output from equalizer 60 is accordingly presumed to have at least some noise, and this output is fed to both a data detector 70 (such as a Viterbi detector) and to a delay circuit 90.

While one skilled in the art recognizes that the data detector 70 may be provided with only one output (as sometimes a control loop will use a single, full decision output signal), data detector 70 has two output signals: one being the full decision output signal "u" of the overall DDCL, and the other output signal being "ue," or the early decision output. Early decision output signal "ue" is fed to reconstruction filter 80. Reconstruction filter 80 filters the sample provided (early decision signal "ue") and a target response, thus producing what is presumed to be the noise-free data-detected signal "yh." Signal "yh" is then fed as a comparative signal back into the control loop to automatic gain control circuit 100*a* and timing control circuit 110*a*.

Because data detection of the data within the symbols of the "y" signal takes a prescribed amount of time, the presumed-noisy data symbol signal "y" is delayed by delay circuit 90, so that the same set of data is ultimately compared in the automatic gain control circuit 100*a* and the timing control circuit 110*a*.

That is, the presumed-noisy data symbol signal "y" is compared to the presumed noise-free signal "yh" in both the automatic gain control circuit 100*a* and the timing circuit 110*a*. Because the presumed noise-free signal "yh" has been previously filtered as described above by reconstruction filter 80, it is presumed to be more accurate than the presumed-noisy data symbol signal "y." The comparison of the presumed noise-free data signal "yh" and the presumed-noisy data symbol signal "y" produces error signal decisions, which drive the control loops that manage automatic gain control circuit 100*a* and timing circuit 110*a*.

More specifically, the decision made in the automatic gain control circuit 100*a* as between the presumed-noisy data symbol signal "y" and the presumed noise-free signal "yh" produces an error signal decision which drives the variable gain amplifier (VGA) 30.

In the case of the timing circuit 110*a*, the decision made therein as between the presumed-noisy data symbol signal "y" and the presumed noise-free signal "yh" produces an error signal decision which drives the A-D converter 50, thereby implementing a desired timing for the DDCL circuit.

Figure 2:
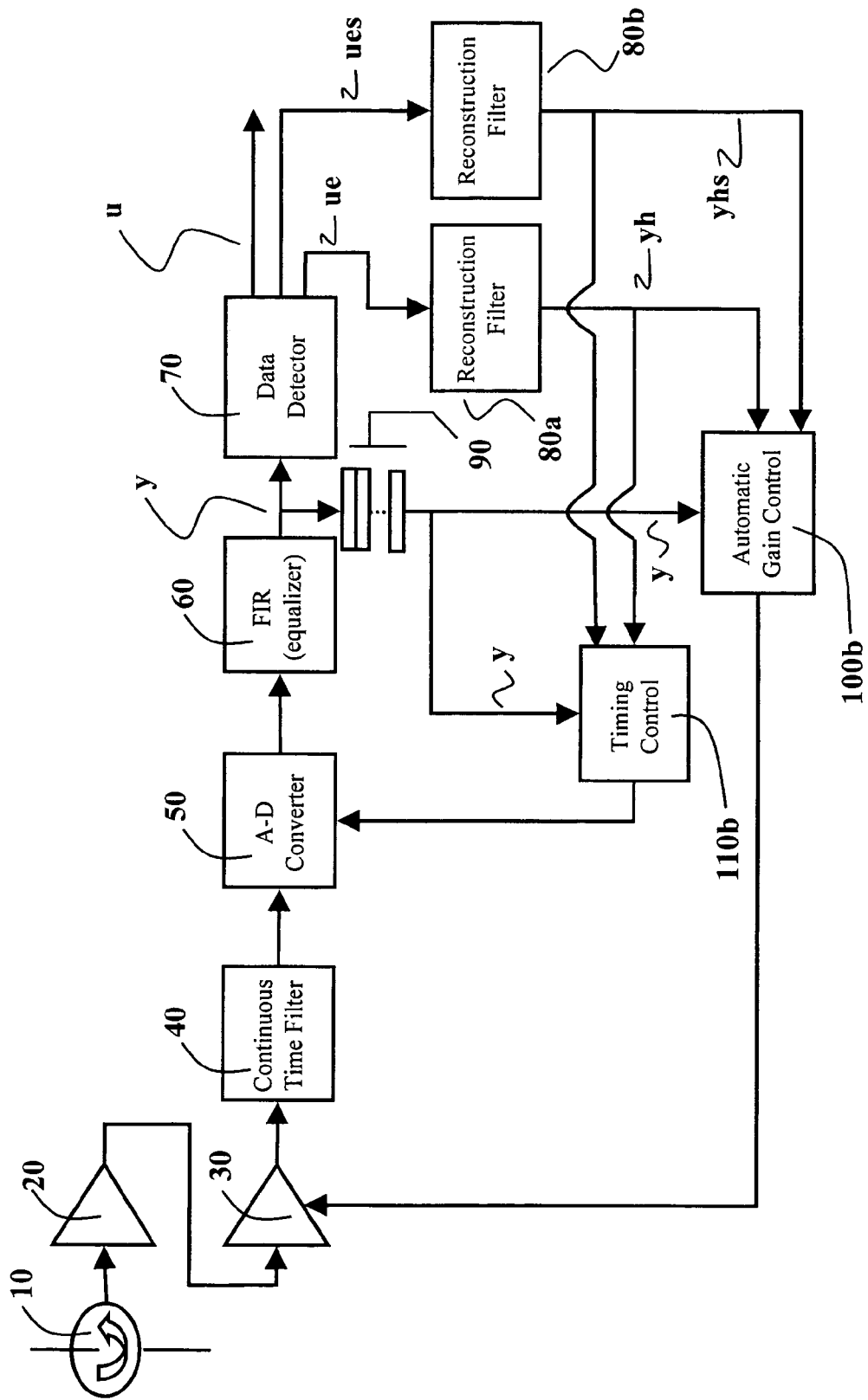
FIG. 2 is an example of data channel circuitry showing examples of improved decision-driven control loop (ID-DCL) circuits in accordance with embodiments of the invention.

FIG. 2 is an example of an improved decision-driven control loop (IDDCL) in accordance with an embodiment of the invention. Portions of FIG. 2 that have been described above in relation to FIG. 1 will not be repeated in the below description, for purposes of brevity and clarity.

As shown in FIG. 2, the presumed-noisy data symbol signal "y" is applied to the data detector 70 and additionally to delay circuit 90. Data detector 70 has three outputs: a full decision signal "u" as the ultimate output of the IDDCL, a first early decision signal "ue," and a second early decision signal "ues." Early decision signals "ue" and "ues" differ from each other in that signal "ue" is based on a shorter memory path than is signal "ues."

Both signals "ue" and "ues" are fed to respective reconstruction filters 80*a* and 80*b*. Therein, the data-detected sample signals "ue" and "ues" are filtered with respective target responses, thus producing data-detected signals "yh" and "yhs."

The signal "yh" is initially used to drive the IDDCL because it is based on a shorter memory path and thus has a shorter data detection latency when being processed at data detector 70 than does the signal "yhs." The signal "yhs," however, by virtue of being based on a longer memory path in the data detector 70, possesses improved accuracy and reliability of data as compared to the "yh" signal.

Therefore, the signal "yh" is earlier in time than the signal "yhs" due to the difference in latency caused by the associated lengths of time required for data detection for shorter and longer memory paths, respectively. Accordingly, the earlier signal ("yh") is initially used to drive the IDDCL.

The decision made in the automatic gain control circuit 100*b* as between the presumed-noisy data symbol signal "y" and the presumed noise-free signal "yh" produces an error signal decision which initially drives the variable gain amplifier (VGA) 30. As applied to the timing circuit 110*b*, the decision made therein as between the presumed-noisy data symbol signal "y" and the presumed noise-free signal "yh" produces an error signal decision which initially drives the A-D converter 50, thereby implementing an initial desired timing for the IDDCL circuit.

The presumed noise-free signal "yh," however, is not always noise-free. While a lower data detection latency may improve loop performance in terms of time, very short memory paths can also result in a degradation of accuracy such that the resultant gains in terms of loop performance time are inutile. Therefore, the second noise-free signal "yhs," based on a longer memory path than for the signal "yh," is used to improve the accuracy of the IDDCL.

Noise-free signal "yhs" is filtered with target responses by reconstruction filter 80*b* as to timing and gain for the sample signal provided (the signal "ues"). While the signal "yh" is initially driving the control loop based on error decisions made in gain control circuit 100*b* and timing control circuit 110*b* (these error decisions being derived from an evaluation between data symbol signal "y" and presumed noise-free reconstructed signal "yh"), the signal "yhs" is subsequently used to correct the loop output if the signal "yh" is different from the "yhs" signal. Since the reliability of the signal "yhs" is likely to be higher than the signal "yh," the signal "yhs" is used to correct the loop in one fashion or another.

In another embodiment, any difference noted as between signal "yh" and "yhs" can result in a previously adopted error decision being undone, with no other output value being added. In yet another embodiment, the signal "yh" is subtracted from the signal "yhs" and this difference is then applied to control the loop. In still a further embodiment, a weighted average is applied to the evaluation of signals "yh" and "yhs," and the product is used to control the loop.

In any event, the signals "yh" and "yhs" are evaluated in both the automatic gain control circuit 100*b* and the timing control circuit 110*b*. The evaluation made in the automatic gain control circuit 100*b* is made in conjunction with the presumed-noisy data symbol signal "y" to produce an error signal decision which drives the variable gain amplifier (VGA) 30. As applied to the timing circuit 110*b*, the signals "yh" and "yhs" are evaluated and this evaluation is then used in conjunction with the presumed-noisy data symbol signal "y" to produce an error signal decision which drives the A-D converter 50, thereby implementing a desired timing for the IDDCL circuit.

While the above description illustrates timing and gain control, one of ordinary skill in the art readily recognizes that the IDDCL can be applied to virtually any circuit or device wherein information is to be transferred; or to control a process. For instance, the invention is applicable to the reading of (or writing to) any of the following, non-exclusive examples: a magnetic storage medium, an optical storage medium, a magneto-optical storage medium, a digital drive, static or erasable memory, or any other circuit or device in which there is a transfer of information from one circuit to another circuit, or from a part of a circuit to another part of the same circuit, or from one device to another device, through wired, wireless, analog and/or digital means; or to control a process.

Additionally, the examples of the invention as herein described are capable of being implemented partly or completely in software.

Figure 3:
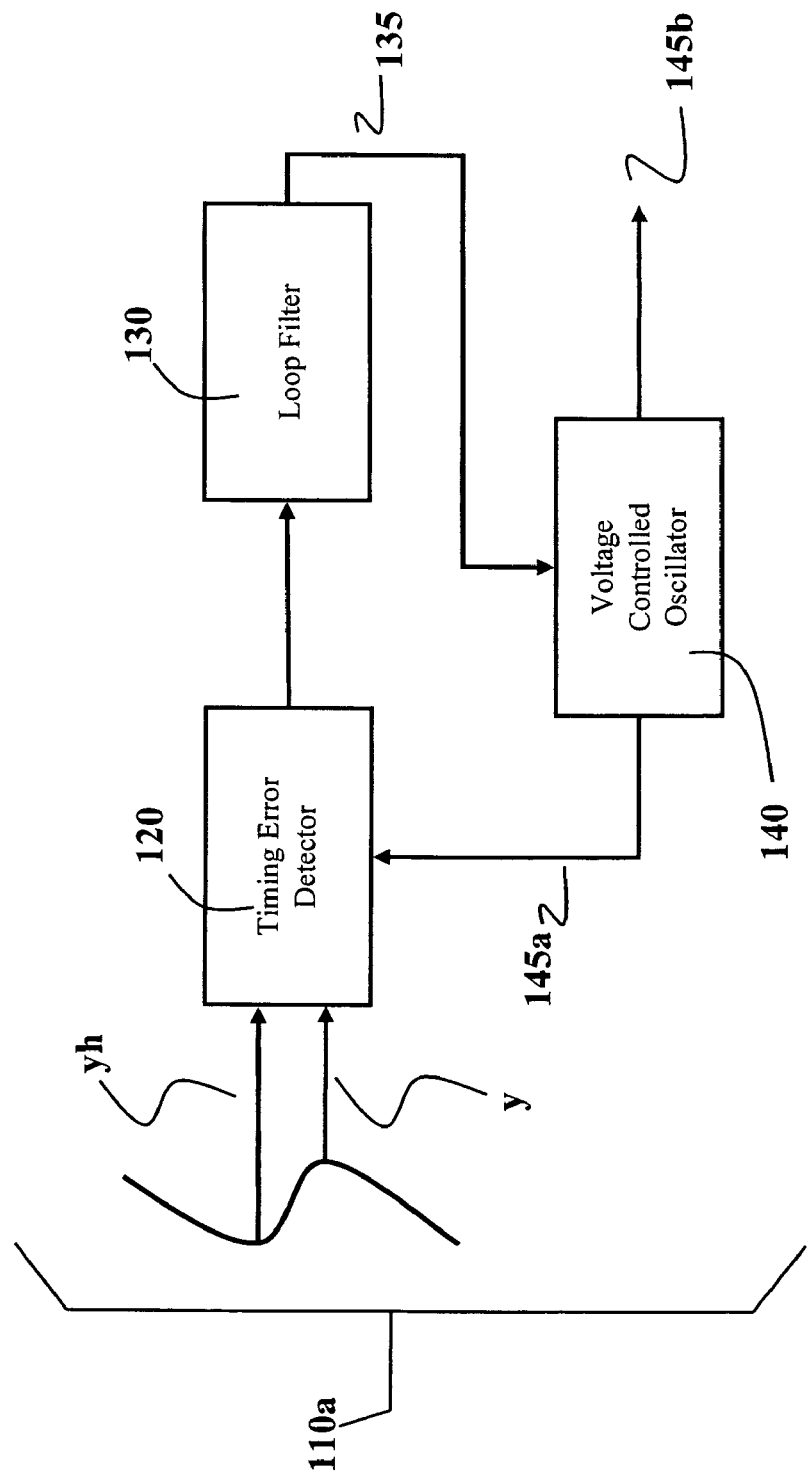
FIG. 3 is an example of a previously known timing control unit.

FIG. 3 is an example of a known timing control unit. As shown in the figure, a presumed noise-free reconstructed signal "yh" is evaluated against data symbol signal "y" in timing error detector 120. Any errors detected as between the timing of the signals "yh" and "y" are provided to loop filter 130. The error-correcting output 135 from loop filter 130 is then used to control the frequency of the voltage controlled oscillator (VCO) 140.

VCO 140 has a feedback loop correction clock signal 145*a* which is an additional input to the timing error detector 120. Correction clock signal 145*a* is used to correct timing errors detected between signals "yh" and "y." An ultimately corrected output is shown by clock signal 145*b*, which is capable of driving an analog-to-digital converter, such as element 50 shown in FIG. 1, for timing control.

Figure 4:
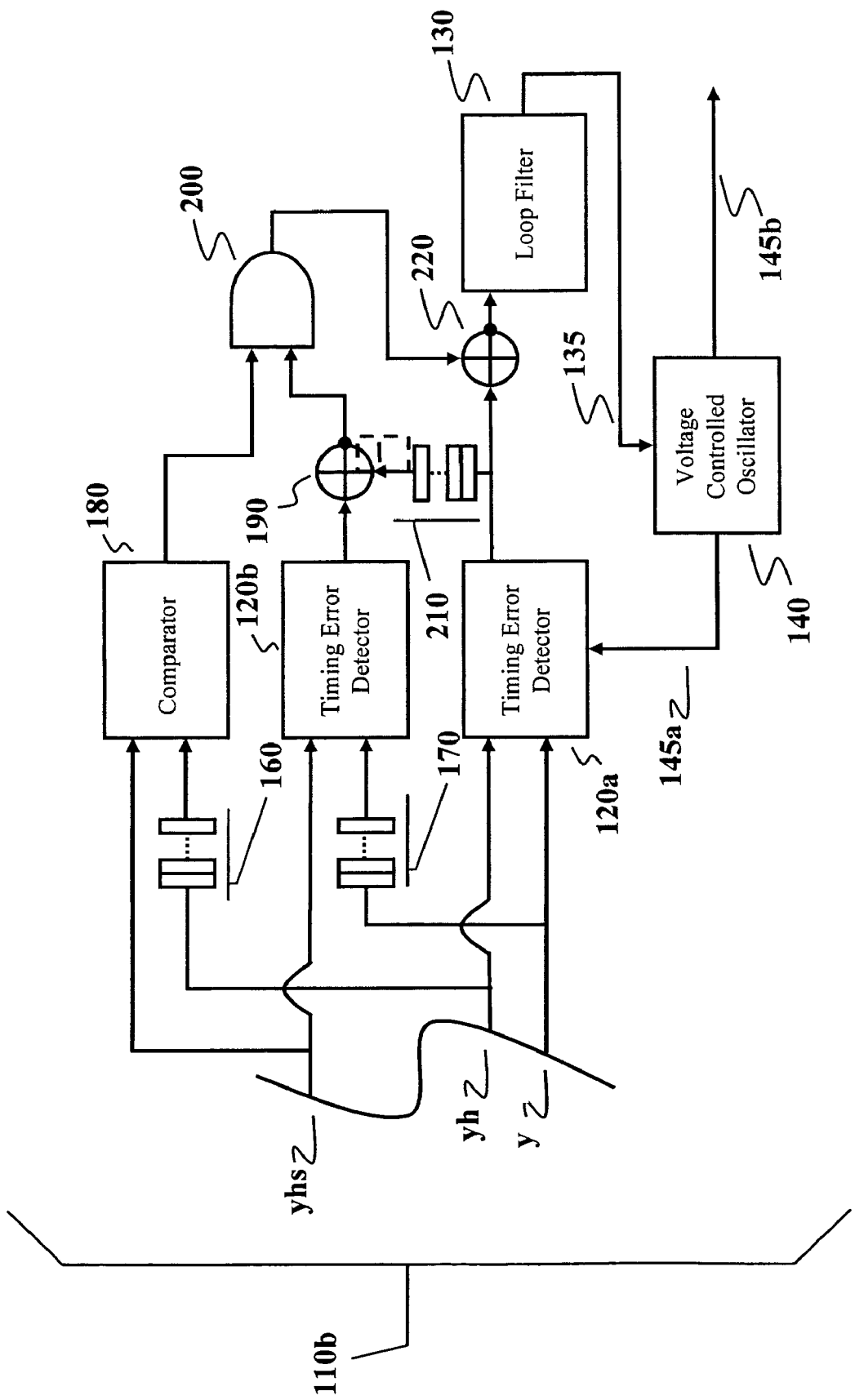
FIG. 4 is a schematic representation of a timing control unit for an improved decision-driven control loop (IDDCL) in accordance with an embodiment of the invention.

FIG. 4 is a schematic representation of a timing control unit for an improved decision-driven control loop (IDDCL) in accordance with an embodiment of the invention. As shown in the figure, presumed-noisy data symbol signal "y" is separately error detected for timing with both the "yh" and "yhs" signals. One skilled in the art notes that the same sections of the original information signal are being evaluated as between "y," "yh" and "yhs" due to delay circuits 160, 170, and 90 (delay circuit 90 is shown in FIGS. 1-2 and is presumed to have already been applied to the signal "y" shown in FIG. 4).

Timing error detector 120*a* detects timing errors between the presumed-noisy data symbol signal "y" and reconstructed signal "yh." The output of timing error detector 120*a* is fed to both a delay circuit 210 and to an adder 220. Delay circuit 210 delays the signal so that the output of detector 120*a* is applied to the same section of the original information signal as is the output of timing error detector 120*b*.

Timing error detector 120*b* detects timing errors between the presumed-noisy data symbol signal "y" and reconstructed signal "yhs." The output of timing error detector 120*b* is fed to adder circuit 190. One skilled in the art readily recognizes that a subtraction circuit could be substituted for adder circuit 190. In any event, the delayed output from the first timing error detector 120*a* is subtracted from the output of the second timing error detector 120*b* by virtue of the output of 120*a* being inverted once it passes through delay circuit 210. The subtraction of the detected first timing error from the detected second timing error effectively removes any error on this signal path (at this point) introduced by the signal "yh."

As further shown in the figure, comparator 180 compares the signal "yhs" with a delayed signal "yh," wherein the delay circuit 160 ensures that the same section of the original information signal is being compared. If there is a difference between the corresponding signals "yh" and "yhs," then a logic level "1" is output to logic circuit 200 (shown as an AND gate by way of example).

In the logic circuit 200, one skilled in the art readily recognizes that any manner of logic gates or circuits could be implemented to practice the invention. In the exemplary logic gate shown by logic circuit 200, if there is a difference between signals "yh" and "yhs," then logic circuit 200 outputs the second timing error detector 120*b* output minus the delayed first timing error detector 120*a* output to adder 220. This effectively removes any detected timing error changes made in timing error detection unit 120*a* due to the signal "yh" and substitutes the timing error detected by timing error detection unit 120*b* (or that timing error detected as between the signals "y" and "yhs").

In adder 220, the output of AND gate 200 is added to the first timing error detector 120*a* output and is then passed to the loop filter 130. The output 135 of the loop filter 130 is then used to control voltage controlled oscillator ("VCO") 140. The output 145*a* of VCO 140 is then fed back to timing error detector 120*a* to correct for any timing errors, with output 145*b* being the ultimate corrected output capable of driving, for example, the timing of an A-D converter such as element 50 shown in FIG. 2.

In an additional embodiment of the invention shown in FIG. 4, the timing error detector outputs from detectors 120*a* and 120*b* may be a function of several input signals "y," "yh," and "yhs" over a period of time. In this case, if the output of comparator 180 is a 1, then it should be held at a 1 until all the outputs of the timing error detector 120*a* that were effected by the error have been corrected. That is, AND gate 200 would be held open for n cycles for n consecutive inputs for the period of time to be corrected.

In yet an additional embodiment of the invention shown in FIG. 4, instead of a comparator 180 or a logic gate 200, the outputs of detectors 120*a* and 120*b* are subtracted from each other, and this new value is then automatically added to the input of the loop filter 130. Accordingly, if signals "yh" and "yhs" are different, the result of the subtraction will be a particular numeral and correction will automatically be made. If the signals "yh" and "yhs" are the same, the difference will be zero, and there will be no correction.

In an additional embodiment, a weighting factor is applied at adder 220. For instance, a factor, f, is applied to the difference derived by subtracting the output of the first error detector 120a from the second error detector 120b. This embodiment can be applied with or without comparator 180 and/or logic gate 200, as one skilled in the art would readily recognize how to apply such features.

Figure 5:
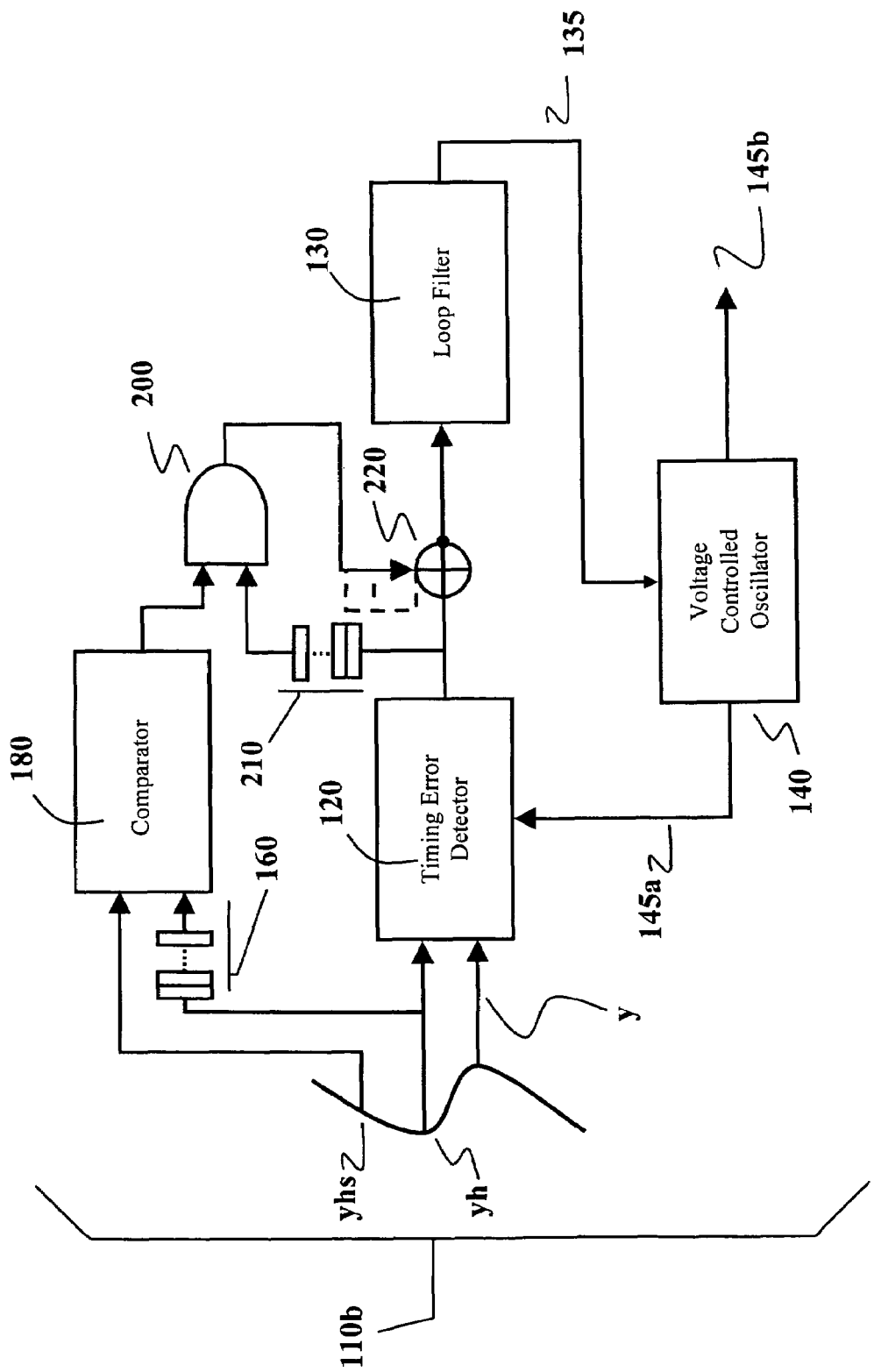
FIG. 5 is an additional schematic representation of a timing control unit for an improved decision-driven control loop (IDDCL) in accordance with a further embodiment of the invention.

FIG. 5 is an additional schematic representation of a timing control unit for an improved decision-driven control loop (IDDCL) in accordance with a further embodiment of the invention. In FIG. 5, a timing control unit simply subtracts the loop filter input in the situation where the signals "yh" and "yhs" differ, as any difference noted between the two signals is presumed to mean that both are inaccurate. To explain in greater detail, if a difference is noted in comparator 180 as between the signals "yh" and "yhs," then both signals "yh" and "yhs" are presumed to be unreliable. In this instance, a logic level of "1" is fed from comparator 180 to logic gate 200.

Further, if a difference is output from timing error detector 120, this output is then delayed by delay circuit 210 and is fed to logic gate 200. If the logic level of "1" has been received by both inputs to the logic gate 200, the output of the timing error detector is output from logic gate 200 and is then inverted and subtracted from the output of the timing error detector 120 at adder 220, thereby eliminating any adjustment in the error signal produced by timing error detector 120 (wherein detector 120 is detecting differences in timing as between data symbol signal "y" and reconstructed signal "yh"). The output of adder 220 is then fed to loop filter 130.

The output 135 of the loop filter is then used to control voltage controlled oscillator ("VCO") 140. The output 145a of VCO 140 is then fed back to timing error detector 120 to correct for any timing errors, with output 145b being the ultimate corrected output capable of driving, for example, the timing of an A-D converter such as element 50 shown in FIG. 2.

In an additional embodiment, it is noted by one skilled in the art that the timing error detector output 120 at time $i(x_i)$ might be a function of several input signals "y" and "yh." In that case, if $yh_{i-\Delta} \neq yhs_i$ (where $\Delta$ denotes latency between early decision signal "yh" and secondary early decision "yhs" outputs), then all timing error detector outputs that are a function of $yh_{i-\Delta}$ must be corrected. For example, if $x_i=(yh_i-yh_{i-2})(yh_{i-1}-y_{i-1})$, and if $yh_{i-\Delta} \neq yhs_i$, $x_{i-\Delta}$, $x_{i-\Delta-1}$, $x_{i-\Delta-2}$ should be subtracted from the loop filter 130 input.

Figure 6:
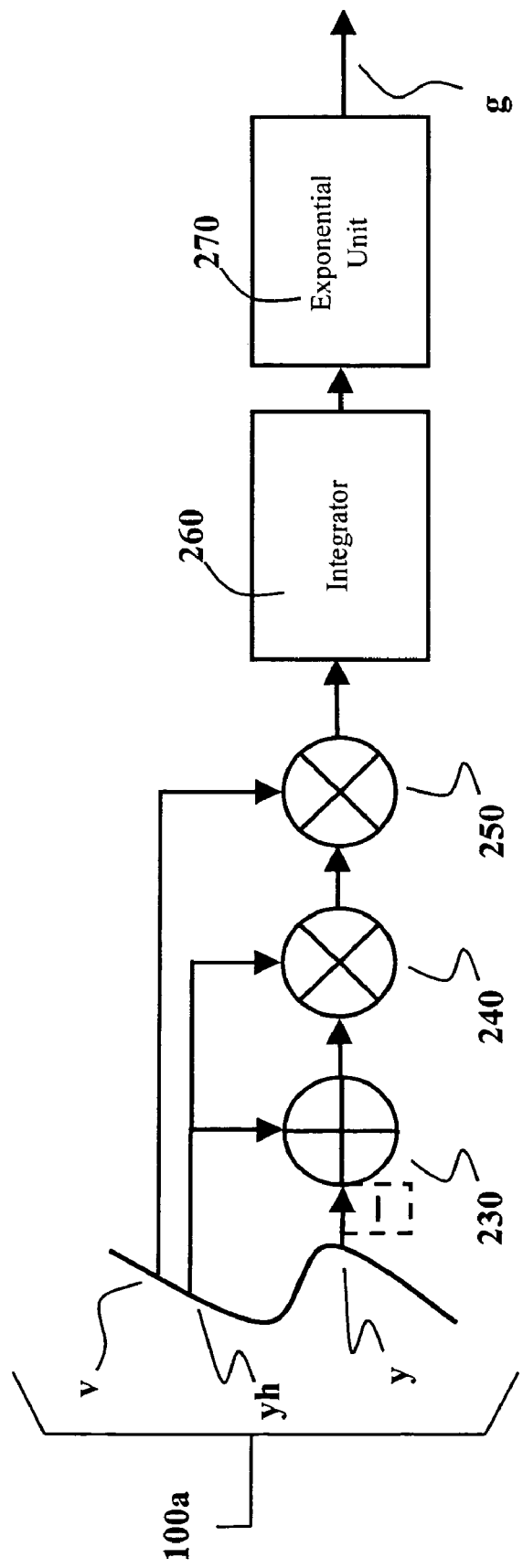
FIG. 6 is an example of a previously known gain control unit.

FIG. 6 is an example of a known gain control unit. In the figure, an error signal generator is shown which computes the difference between the reconstructed signal "yh" and the data symbol signal "y" at adder 230 to produce the error signal $e_i=yh_i-y_i$, (wherein e is the error signal used to drive the loop).

The output of adder 230 is then multiplied by the reconstructed signal "yh" at multiplier 240. The output of multiplier 240 is then multiplied by a loop gain, v, at multiplier 250, and this product is then passed to the integrator 260. The integrator output is then passed through an exponent unit 270 which computes the exponential of the integrator 260 output. The resultant product is the desired gain value used to drive, for example, the VGA 30 shown in FIG. 1.

Figure 7:
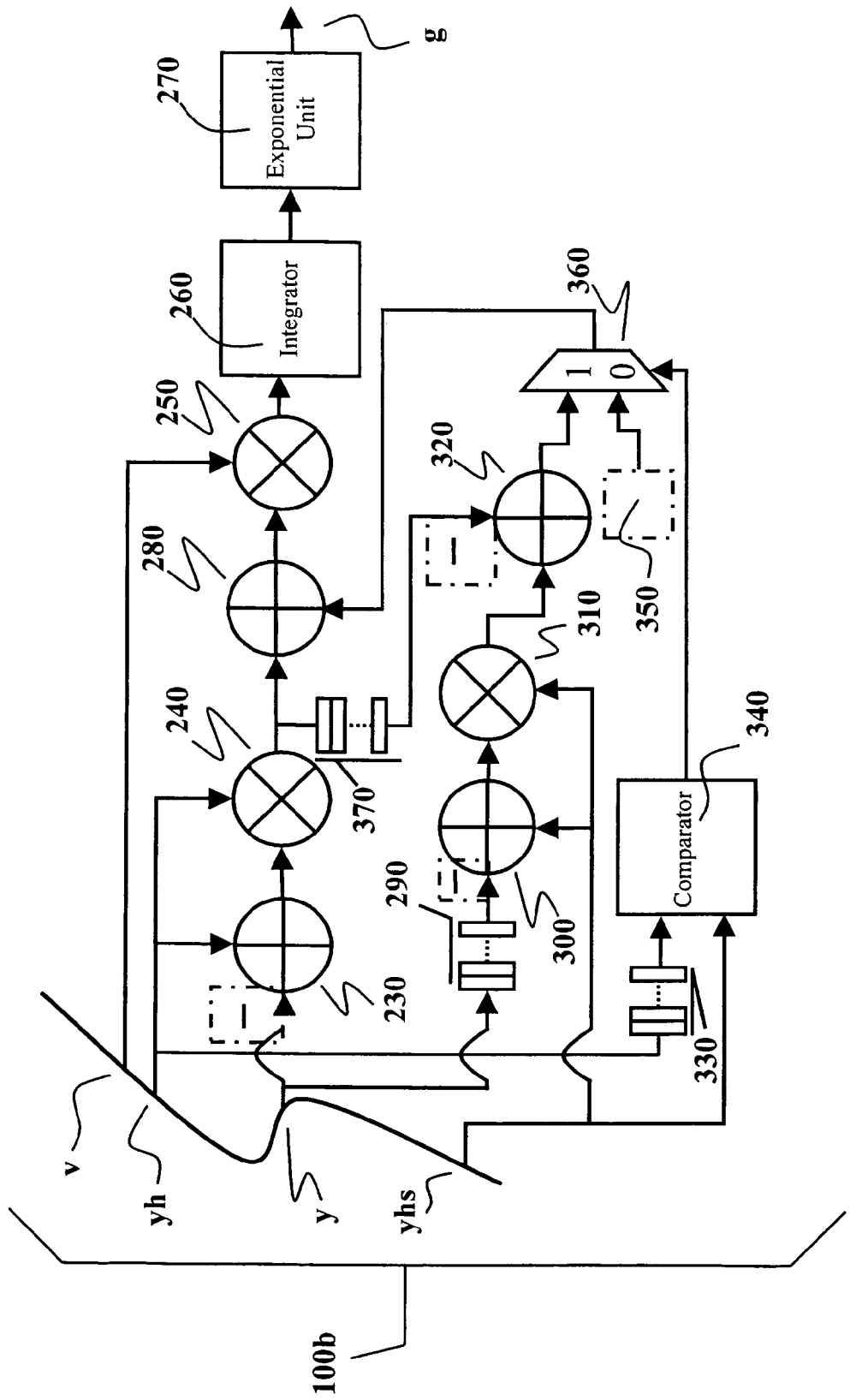
FIG. 7 is a schematic representation of a gain control unit for an improved decision-driven control loop (IDDCL) in accordance with an additional embodiment of the invention.

FIG. 7 is a schematic representation of a gain control unit for an improved decision-driven control loop (IDDCL) in accordance with an additional embodiment of the invention. Data symbol signal "y" is separately compared to both reconstructed signals "yh" and "yhs." Further, reconstructed signals "yh" and "yhs" are also compared to each other. In this example, if differences are noted as between "yh" and "yhs," then "yh" is presumed to be unreliable and the error-correction depends upon the "yhs" signal as it is presumed to be more reliable due to being based on a longer memory path in data detector 70.

To explain in greater detail, data symbol signal "y" is applied to an adder 230 and also to a delay circuit 290. Once delayed by delay circuit 290, the data symbol signal "y" is applied to an adder 300. At both the adder 230 and the adder 300, the data symbol signal "y" is inverted.

The signal "yh" is also applied to adder 230, wherein this value has the data symbol signal "y" thus subtracted from it as the data symbol signal "y" has been inverted. The product of adder 230 is then fed to multiplier 240, where the signal "yh" is multiplied against the product of adder 230. The output of multiplier 240 is then fed to a delay circuit 370, as well as to an adder 280.

At adder 300, the signal "y" is subtracted (by virtue of having been inverted) from the signal "yhs." The product of adder 300 is then fed to multiplier 310, wherein the signal "yhs" is multiplied times the product of adder 300. The output of multiplier 310 is then fed to adder 320.

Reconstructed signal "yh" is delayed by delay circuit 330 and then, with reconstructed "yhs," compared at comparator 340, wherein if the signals are equal, comparator 340 issues a logic level of "0" as an output. If the signals are not equal, comparator 340 issues a logic level of "1" as an output. The output of comparator 340 is fed to selector 360.

Delay circuit 370 delays the output of the multiplier 240 so that the same segment of the original information signal is ultimately evaluated at adder 320 and selector 360. That is, the output of delay circuit 370 is fed to adder 320, before which the output of delay circuit 370 is inverted. The output of multiplier 310 is also applied to adder 320. This value is then input to the selector 360.

At selector 360, a selectable input 350 (selectable input 350 may be any predetermined input, for example, a default value or an operator input as further explained herein) and the output of adder 320 are evaluated based on the output from comparator 340. If the signal "yhs" differs from the signal "yh" at comparator 340, then selector 360 issues the sum added in adder 320 to adder 280. This effectively removes the previous changes in the potential error correction signal made by the integration of the signal "yh" with the signal "y," and replaces the error correction to be applied at adder 280 with the integration of the signals "yhs" and "y" via selector 360. If the signal "yhs" does not differ from the signal "yh" at comparator 340, then selector 360 issues the selectable input 350 as an output to adder 280.

In an additional embodiment of the invention shown in FIG. 7, the adder 320 output may be a function of several input signals "y," "yh," and "yhs" over a period of time. In this case, if the output of comparator 340 is a 1, then it should be held at a 1 until all the outputs of adder 320 that were affected by the error have been corrected. That is, selector 360 would be held open for n cycles for n consecutive inputs for the period of time to be corrected.

In yet an additional embodiment of the invention shown in FIG. 7, there is not a comparator 340 or a selector 360. Instead, the inputs to adder 320 are continuously evaluated against each other to produce a new value (for example, the output of delay circuit 370 may be continuously subtracted from the output of multiplier 310), and this new value is then automatically added to the input of the integrator 260 at adder 280. Accordingly, if signals "yh" and "yhs" are different, the result of the subtraction will be a particular value and correction will automatically be made. If the signals "yh" and "yhs" are the same, the difference will be zero, and there thus will be no correction.

In an additional embodiment, a weighting factor is applied to the circuit. For instance, a factor, f, is continually applied to the output of the adder 320. This embodiment can be applied with or without comparator 340 and/or selector 360, as one skilled in the art would readily recognize how to apply such features of this invention.

In an additional embodiment, the output of delay circuit 370 is only subtracted at adder 320 where signals "yh" and "yhs" differ.

In yet a further embodiment, selector 360 allows selections to be made using input 350. Selectable input 350 may be any predetermined input, for example, a default value or an operator input. Such may be useful to reinforce a correct decision, for instance, a possibly attenuated signal from delay 370 could be used as selectable input 350 to reinforce a correct decision. That is, the "yh" signal may be correct, but is not to be entirely trusted because it is based on a shorter memory path; therefore, if the secondary decision indicates that the initial decision was in fact good, the reinforced decision is re-inserted to increase an effective gain (i.e., passing an attenuated signal from delay 370 as input 350). Skilled artisans recognize that selector 360 could instead be a multiplexer or a logic gate.

In the exemplary embodiments described above in relation to FIG. 7, the output of adder 280 is multiplied by a loop gain, v, at multiplier 250, and this product is then passed to the integrator 260. The integrator output is then passed through an exponent unit 270 which computes the exponential of the integrator 260 output. The resultant product is the desired gain value used to drive, for example, the variable gain amplifier 30 shown in FIG. 2.

Figure 8:
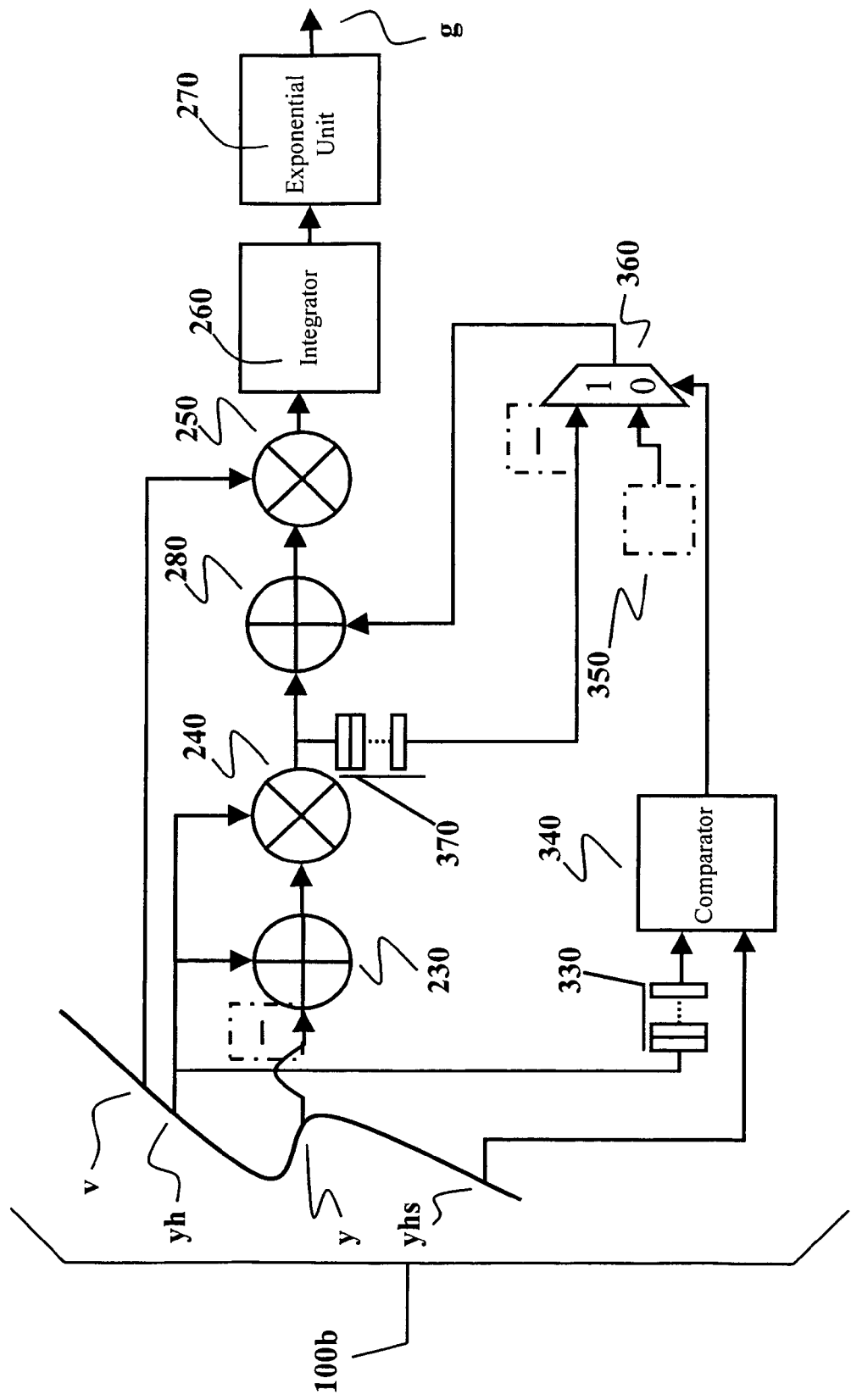
FIG. 8 is a schematic representation of an additional gain control unit for an improved decision-driven control loop (IDDCL) in accordance with an additional embodiment of the invention.

An additional embodiment of the invention applied to a gain control unit is shown in FIG. 8. As illustrated in the figure, if a difference is noted in comparator 340 as between the yh signal and the yhs signal, then both signals yh and yhs are presumed to be unreliable. In this instance, a logic level of "1" is then fed from comparator 340 to selector 360.

The output of multiplier 240 is delayed by delay circuit 370. At selector 360, there are three inputs: the output of delay circuit 370, the selectable input 350, and the output of comparator 340. The output of comparator 340 determines which of the inputs to the selector 360 are passed as the output of the selector. That is, in one example, if a logic level of "1" has been received from comparator 340 to the selector 360, then the output of adder 320 is output from selector 360. This thus subtracts any change made by the integrator circuit comprising adder 230 and multiplier 240 in relation to the signal "yh," eliminating any adjustment in the error signal produced (wherein the integrator circuit comprising elements 230 and 240 produces a gain value by integrating data symbol signal "y" and reconstructed signal "yh"). Conversely, if the output of comparator 340 is a logic level of "0" (denoting no difference between the signals "yh" and "yhs"), then the selectable input 350 is passed as the output of selector 360. In any event, the output of selector 360 is then fed as one of the inputs to adder 280, to be combined with the output of multiplier 240.

The output of adder 280 is then fed to integrator 260 and the remainder of the processing is similar to that described in relation to FIG. 7, above, so that the overall gain of the circuit can be adjusted. For instance, the output of the exponential unit 270 may be used to drive a variable gain amplifier, such as element 30 shown in FIG. 2.

Figure 9:
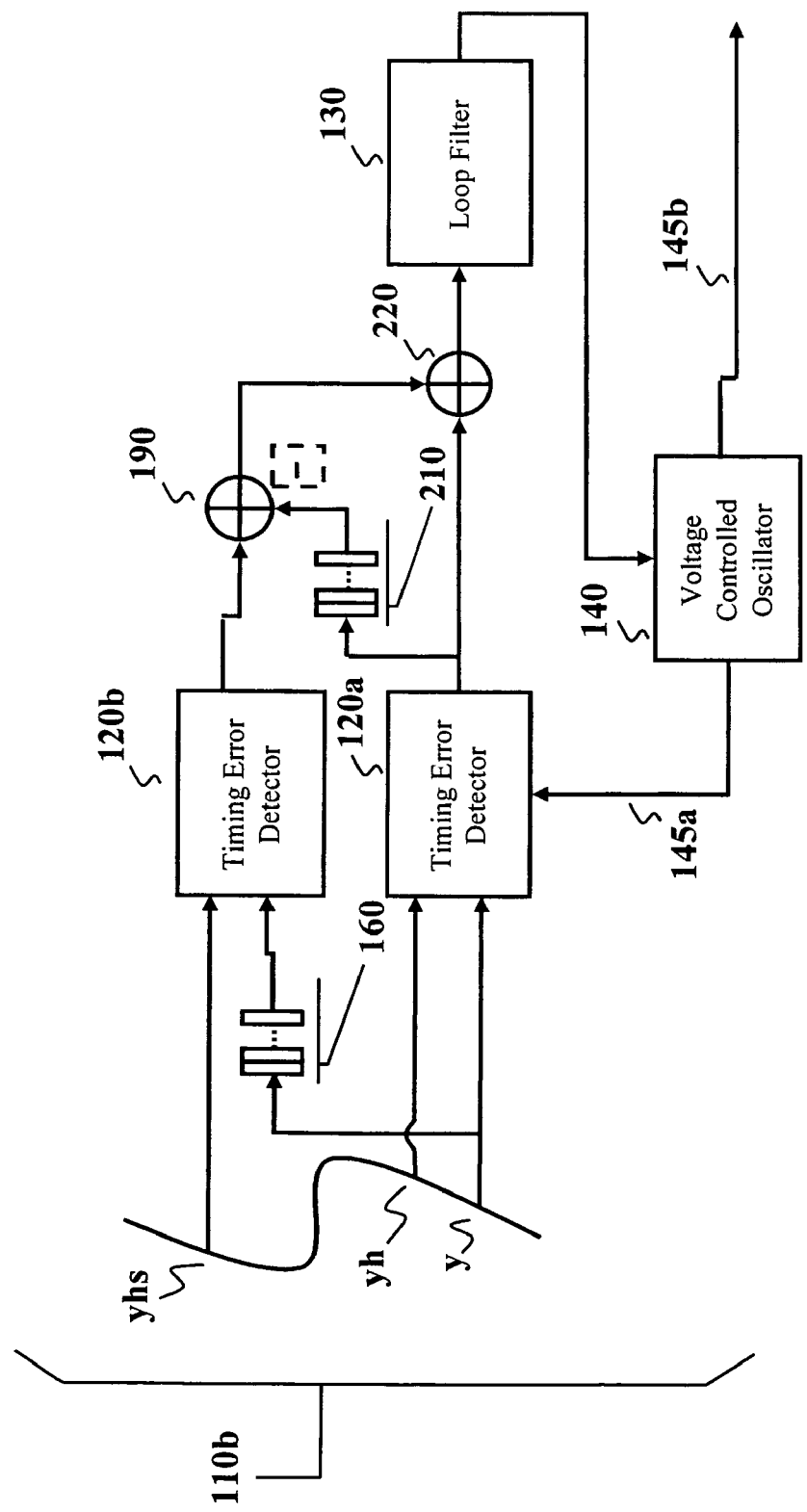
FIG. 9 is a schematic representation of an additional timing control unit for an improved decision-driven control loop (IDDCL) in accordance with a further embodiment of the invention.

FIG. 9 is an example of an improved decision-driven control loop (IDDCL) in accordance with an additional embodiment of the invention. Because the embodiment of the invention shown in FIG. 9 is similar in nature to the above description of FIG. 4, portions of FIG. 9 that have been described above in relation to FIG. 4 will not be repeated in the below description, for purposes of brevity and clarity.

In FIG. 9, the inputs to adder 190 are continuously evaluated against each other to produce a new value (for example, the output of delay circuit 210 may be continuously subtracted from the output of timing error detector 120b), and this new value is then automatically added to the input of the loop filter 130 at adder 220. Accordingly, if signals "yh" and "yhs" are different, the result of the subtraction will be a particular value and correction to the control loop will automatically be made. If the signals "yh" and "yhs" are the same, the difference will be zero, and there thus will be no correction to the control loop.

Figure 10:
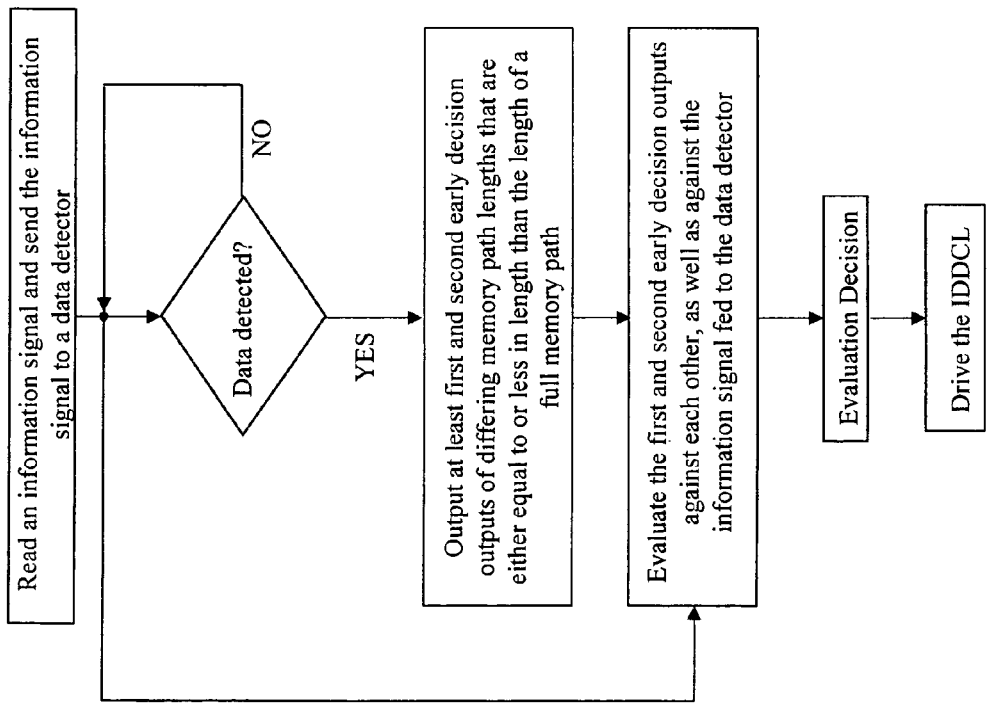
FIG. 10 is a flowchart diagram of the implementation of an improved decision-driven control loop (IDDCL) in accordance with a further embodiment of the invention.

FIG. 10 is a flowchart showing the general sequence of operation of the improved decision-driven control loop (IDDCL). In FIG. 10, an information signal is read and sent to a data detector. If no data is detected at the data detector, the data detector simply waits until data is detected. Then, once data is detected at the data detector, the data detector outputs at least first and second early decision outputs of differing memory path lengths that are all equal to or less in length than the length of a full memory path.

Next, the first and second early decisions are evaluated against each other, as well as against the information signal fed to the data detector, to produce an evaluation decision. The evaluation decision is then used to drive the improved decision-driven control loop (IDDCL).

Figure 11:
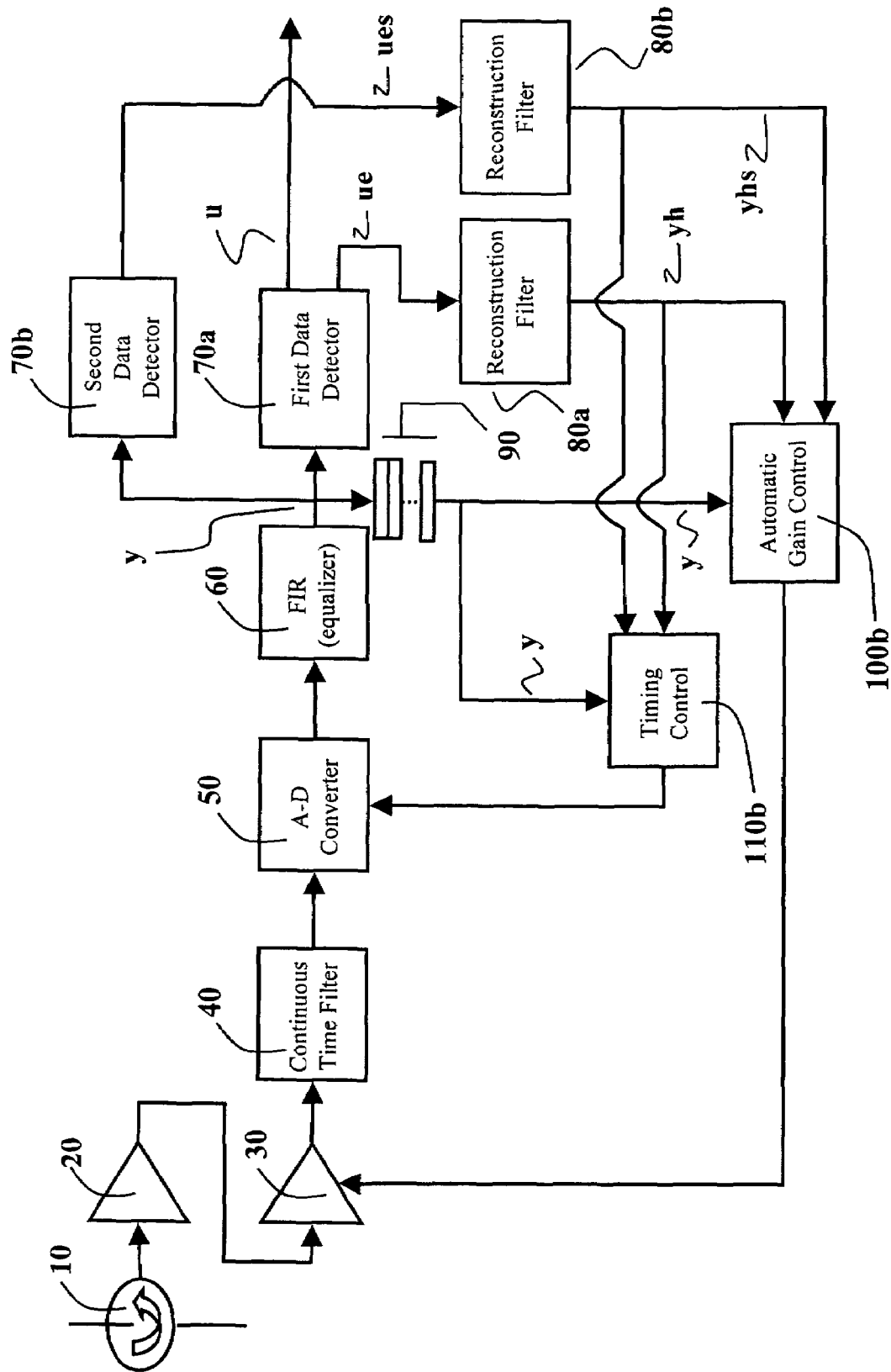
FIG. 11 is a schematic representation of data channel circuitry including improved decision-driven control loop (IDDCL) circuitry in accordance with a further embodiment of the invention.

FIG. 11 is an example of an improved decision-driven control loop (IDDCL) in accordance with an additional embodiment of the invention. Because the embodiment of the invention shown in FIG. 11 is similar in nature to the above description of FIG. 2, portions of FIG. 11 that have been described above in relation to FIG. 2 will not be repeated in the below description, for purposes of brevity and clarity.

In FIG. 11, first data detector 70a is used to produce the first early decision output, the "ue" signal. Further, second data detector 70b is used to produce the second early decision output, the "ues" signal. First data detector 70a may be a peak-detector or a slicer, while second data detector 70b may be a Viterbi detector. A skilled artisan understands that detector 70a could thus be endowed with a very small latency, while detector 70b could be optimized for enhanced error rate performance. The skilled artisan also recognizes that output signal "u," while shown as coming from data detector 70a, could just as easily come from data detector 70b or from a combination of the outputs of 70a and 70b.

In the above embodiments, the IDDCL has improved accuracy, speed, and flexibility. That is, accuracy is improved in that the signal "yhs" is based on a relatively longer memory path; speed is improved in that signal "yh" is based on a relatively shorter memory path; and flexibility of decision is enabled, in that the signal "yh" may be replaced by the signal "yhs," or the previous correction made with the signal "yh" can simply be removed from any correction of the IDDCL, or signal "yh" may be subtracted from signal "yhs," or a weighted factor may be applied to the two.

Such embodiments of the IDDCL can improve the accuracy, speed and flexibility of virtually any circuit or device wherein information is to be transferred; or to improve control of a process. For instance, the invention has the potential to improve the reading of (or writing to) any of the following, non-exclusive examples: a magnetic storage medium, an optical storage medium, a magneto-optical storage medium, a digital drive, static or erasable memory, or any other circuit or device in which there is a transfer of information from one circuit to another circuit, or from a part of a circuit to another part of the same circuit, or from one device to another device, through wired, wireless, analog and/or digital means; or to improve control of a process. Additionally, the descriptions of the invention herein provided are capable of being implemented in software contained in any of a number of forms, as will be readily apparent to ordinarily skilled artisans.

The previous description of the embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. For example, some or all of the features of the different embodiments discussed above may be deleted from the embodiment. Therefore, the present invention is not intended to be limited to the embodiments described herein but is to be accorded the widest scope defined only by the claims below and equivalents thereof.

What is claimed is:

1. A decision-driven control loop comprising:
a data detector producing first and second early decision outputs; and
processing circuitry receiving said first and second early decision outputs and producing a processing output to drive the decision-driven control loop, wherein
said processing circuitry comprises a comparator, and wherein
said first early decision output is initially used to produce said processing output to drive said control loop at least until said comparator compares said first and second early decision outputs, and
if the comparison between said first and second early decision outputs indicates a difference, then any correction initially made to the processing output based on said first early decision output is undone.

2. The decision-driven control loop of claim 1, wherein said data detector produces said first and second early decision outputs based on memory paths of differing lengths.

3. The decision-driven control loop of claim 2, wherein said memory paths of differing lengths are equal to or less than the length of a full memory path.

4. The decision-driven control loop of claim 1, wherein, when the comparison between said first and second early decision outputs indicates a difference and any correction initially made to the processing output based on said first early decision output is undone,
the second early decision output is not used to produce said processing output.

5. The decision-driven control loop of claim 1, wherein said processing circuitry comprises:
a first reconstruction filter which produces a first correction output signal in response to said first early decision output; and
a second reconstruction filter which produces a second correction output signal in response to said second early decision output; wherein
said processing output comprises said first and second correction output signals.

6. The decision-driven control loop of claim 5, wherein the processing circuitry further comprises a first timing error detector which detects a timing error between said first correction output signal and an input signal to said data detector.

7. The decision-driven control loop of claim 6, wherein the processing circuitry further comprises a second timing error detector which detects a timing error between said second correction output signal and an input signal to said data detector.

8. The decision-driven control loop of claim 7, wherein the processing circuitry further comprises a comparator for comparing said first and second correction output signals.

9. The decision-driven control loop of claim 8, wherein the processing circuitry further comprises a logic gate for evaluating the output of the comparator with a combined output of said first and second timing error detectors to produce a logic gate output.

10. The decision-driven control loop of claim 9, wherein the processing circuitry further comprises a loop filter receiving an input comprising a combination of said logic gate output and the output of the first timing error detector.

11. The decision-driven control loop of claim 10, wherein the processing circuitry further comprises a voltage controlled oscillator receiving an output of the loop filter.

12. The decision-driven control loop of claim 5, wherein the processing circuitry further comprises:
a comparator receiving said first and second correction output signals; and
a selector receiving an output of said comparator, and at least one signal related to said first and second correction signals, wherein said processing output is related to an output of said selector.

13. The decision-driven control loop of claim 12, wherein the processing circuitry further comprises first circuitry for processing an output of said selector with a signal related to said first correction output signal to provide said processing output.

14. The decision-driven control loop of claim 13, wherein the processing circuitry further comprises second circuitry for producing said processing output as an output gain value.

15. The decision-driven control loop of claim 14, wherein said second circuitry receives a loop gain value and combines said loop gain value with said output of said selector and said signal related to said first correction output signal to provide said output gain value.

16. The decision-driven control loop of claim 15, wherein said selector receives as a further input, a selectable input; wherein
said comparator output enables said selector to select between said selectable input and said at least one signal related to said first and second correction signals as an output of said selector.

17. The decision-driven control loop of claim 16, wherein said second circuitry further comprises an integrator and an exponential unit to produce said output gain value.

18. The decision-driven control loop of claim 1, wherein said processing circuitry performs a subtraction between said first and second early decision outputs, wherein the result of the subtraction produces said processing output.

19. The decision-driven control loop of claim 1, wherein said processing circuitry receives a loop gain value to produce a gain value output as said processing output.

20. A read channel comprising:
a decision-driven control loop according to claim 1; and
at least one of a variable gain amplifier and an analog-to-digital converter receiving said processing output.

21. The read channel of claim 20, wherein said data detector produces said first and second early decision outputs based on memory paths of differing lengths.

22. The read channel of claim 21, wherein said memory paths of differing lengths are equal to or less than the length of a full memory path.

23. The read channel of claim 20, wherein,
when the comparison between said first and second early decision outputs indicates a difference and any correction initially made to the processing output based on said first early decision output is undone,
the second early decision output is not used to produce said processing output.

24. The read channel of claim 20, wherein said processing circuitry comprises:
a first reconstruction filter which produces a first correction output signal in response to said first early decision output; and
a second reconstruction filter which produces a second correction output signal in response to said second early decision output; wherein
said processing output comprises said first and second correction output signals.

25. The read channel of claim 24, wherein the processing circuitry further comprises a first timing error detector which detects a timing error between said first correction output signal and an input signal to said data detector.

26. The read channel of claim 25, wherein the processing circuitry further comprises a second timing error detector which detects a timing error between said second correction output signal and an input signal to said data detector.

27. The read channel of claim 26, wherein the processing circuitry further comprises a comparator for comparing said first and second correction output signals.

28. The read channel of claim 27, wherein the processing circuitry further comprises a logic gate for evaluating the output of the comparator with a combined output of said first and second timing error detectors to produce a logic gate output.

29. The read channel of claim 28, wherein the processing circuitry further comprises a loop filter receiving an input comprising a combination of said logic gate output and the output of the first timing error detector.

30. The read channel of claim 29, wherein the processing circuitry further comprises a voltage controlled oscillator receiving an output of the loop filter.

31. The read channel of claim 24, wherein the processing circuitry further comprises:
a comparator receiving said first and second correction output signals; and
a selector receiving an output of said comparator, and at least one signal related to said first and second correction signals, wherein said processing output is related to an output of said selector.

32. The read channel of claim 31, wherein the processing circuitry further comprises first circuitry for processing an output of said selector with a signal related to said first correction output signal to provide said processing output.

33. The read channel of claim 32, wherein the processing circuitry further comprises second circuitry for producing said processing output as an output gain value.

34. The read channel of claim 33, wherein said second circuitry receives a loop gain value and combines said loop gain value with said output of said selector and said signal related to said first correction output signal to provide said output gain value.

35. The read channel of claim 34, wherein said selector receives as a further input, a selectable input; wherein
said comparator output enables said selector to select between said selectable input and said at least one signal related to said first and second correction signals as an output of said selector.

36. The read channel of claim 35, wherein said second circuitry further comprises an integrator and an exponential unit to produce said output gain value.

37. The read channel of claim 20, wherein said processing circuitry performs a subtraction between said first and second early decision outputs, wherein the result of the subtraction produces said processing output.

38. The read channel of claim 20, wherein said processing circuitry receives a loop gain value to produce a gain value output as said processing output.

39. The read channel of claim 20, wherein said first and second early decisions derive from separate data detectors in said decision-driven control loop.

40. The decision-driven control loop of claim 1, wherein said first and second early decisions derive from separate data detectors.

41. A decision-driven control loop comprising:
detector means for producing first and second early decision outputs; and
processing means, receiving said first and second early decision outputs, for producing a processing output to drive the decision-driven control loop
wherein said processing means comprises comparator means for comparing said first and second early decision outputs, and
wherein said first early decision output is initially used to produce said processing output to drive said control loop at least until said comparator compares said first and second early decision outputs, and
if the comparison between said first and second early decision outputs indicates a difference, then any correction initially made to the processing output based on said first early decision output is undone.

42. The decision-driven control loop of claim 41, wherein said detector means produces said first and second early decision outputs based on memory paths of differing lengths.

43. The decision-driven control loop of claim 42, wherein said memory paths of differing lengths are equal to or less than the length of a full memory path.

44. The decision-driven control loop of claim 41, wherein,
when the comparison between said first and second early decision outputs indicates a difference and any correction initially made to the processing output based on said first early decision output is undone,
the second early decision output is not used to produce said processing output.

45. The decision-driven control loop of claim 41, wherein said processing means comprises:
first reconstruction filter means for producing a first correction output signal in response to said first early decision output; and
second reconstruction filter means for producing a second correction output signal in response to said second early decision output; wherein
said processing output comprises said first and second correction output signals.

46. The decision-driven control loop of claim 45, wherein the processing means comprises first timing error detector means for detecting a timing error between said first correction output signal and an input signal to said detector means.

47. The decision-driven control loop of claim 46, wherein the processing means comprises second timing error detector means for detecting a timing error between said second correction output signal and an input signal to said detector means.

48. The decision-driven control loop of claim 47, wherein the processing means further comprises comparator means for comparing said first and second correction output signals.

49. The decision-driven control loop of claim 48, wherein the processing means further comprises logic gate means for evaluating the output of the comparator means with a combined output of said first and second timing error detector means to produce a logic gate output.

50. The decision-driven control loop of claim 49, wherein the processing means further comprises a loop filter receiving an input comprising a combination of said logic gate output and the output of the first timing error detector means.

51. The decision-driven control loop of claim 50, wherein the processing means further comprises a voltage controlled oscillator receiving an output of the loop filter.

52. The decision-driven control loop of claim 45, wherein the processing means further comprises:
comparator means for comparing said first and second correction output signals; and
selector means, receiving an output of said comparator and at least one signal related to said first and second correction signals, for selecting between said at least one signal related to said first and second correction signals and at least another signal, wherein said processing output is related to an output of said selector means.

53. The decision-driven control loop of claim 52, wherein the processing means further comprises first circuitry means for processing an output of said selector means with a signal related to said first correction output signal to provide said processing output.

54. The decision-driven control loop of claim 53, wherein the processing means further comprises second circuitry means for producing said processing output as an output gain value.

55. The decision-driven control loop of claim 54, wherein said second circuitry means receives a loop gain value and combines said loop gain value with said output of said selector means and said signal related to said first correction output signal to provide said output gain value.

56. The decision-driven control loop of claim 55, wherein said selector means receives as a further input, a selectable input; wherein
said comparator output enables said selector means to select between said selectable input and said at least one signal related to said first and second correction signals as an output of said selector means.

57. The decision-driven control loop of claim 56, wherein said second circuitry means further comprises an integrator and an exponential unit to produce said output gain value.

58. The decision-driven control loop of claim 41, wherein said processing means performs a subtraction between said first and second early decision outputs, wherein the result of the subtraction produces said processing output.

59. The decision-driven control loop of claim 41, wherein said processing means receives a loop gain value to produce a gain value output as said processing output.

60. A read channel comprising:
a decision-driven control loop according to claim 41; and
at least one of a variable gain amplifier means and an analog-to-digital conversion means receiving said processing output.

61. The read channel of claim 60, wherein said detector means produces said first and second early decision outputs based on memory paths of differing lengths.

62. The read channel of claim 61, wherein said memory paths of differing lengths are equal to or less than the length of a full memory path.

63. The read channel of claim 60, wherein,
when the comparison between said first and second early decision outputs indicates a difference and any correction initially made to the processing output based on said first early decision output is undone,
the second early decision output is not used to produce said processing output.

64. The read channel of claim 60, wherein said processing means comprises:
first reconstruction filter means for producing a first correction output signal in response to said first early decision output; and
second reconstruction filter means for producing a second correction output signal in response to said second early decision output; wherein
said processing output comprises said first and second correction output signals.

65. The read channel of claim 64, wherein the processing means comprises first timing error detector means for detecting a timing error between said first correction output signal and an input signal to said detector means.

66. The read channel of claim 65, wherein the processing means comprises second timing error detector means for detecting a timing error between said second correction output signal and an input signal to said detector means.

67. The read channel of claim 66, wherein the processing means further comprises comparator means for comparing said first and second correction output signals.

68. The read channel of claim 67, wherein the processing means further comprises logic gate means for evaluating the output of the comparator means with a combined output of said first and second timing error detector means to produce a logic gate output.

69. The read channel of claim 68, wherein the processing means further comprises a loop filter receiving an input comprising a combination of said logic gate output and the output of the first timing error detector means.

70. The read channel of claim 69, wherein the processing means further comprises a voltage controlled oscillator receiving an output of the loop filter.

71. The read channel of claim 64, wherein the processing means further comprises:
comparator means for comparing said first and second correction output signals; and
selector means, receiving an output of said comparator and at least one signal related to said first and second correction signals, for selecting between said at least one signal related to said first and second correction signals and at least another signal, wherein said processing output is related to an output of said selector means.

72. The read channel of claim 71, wherein the processing means further comprises first circuitry means for processing an output of said selector means with a signal related to said first correction output signal to provide said processing output.

73. The read channel of claim 72, wherein the processing means further comprises second circuitry means for producing said processing output as an output gain value.

74. The read channel of claim 73, wherein said second circuitry means receives a loop gain value and combines said loop gain value with said output of said selector means and said signal related to said first correction output signal to provide said output gain value.

75. The read channel of claim 74, wherein said selector means receives as a further input, a selectable input; wherein
said comparator output enables said selector means to select between said selectable input and said at least one signal related to said first and second correction signals as an output of said selector means.

76. The read channel of claim 75, wherein said second circuitry means further comprises an integrator and an exponential unit to produce said output gain value.

77. The read channel of claim 60, wherein said processing means performs a subtraction between said first and second early decision outputs, wherein the result of the subtraction produces said processing output.

78. The read channel of claim 60, wherein said processing means receives a loop gain value to produce a gain value output as said processing output.

79. A method for driving a decision-driven control loop comprising:
detecting data to produce first and second early decision outputs; and
processing said first and second early decision outputs to produce a processing output that drives the decision-driven control loop, wherein
said processing comprises comparing said first and second early decision outputs to produce said processing output, wherein
said first early decision output is initially used to produce said processing output to drive said control loop at least until said comparison between said first and second early decision outputs, and
if the comparison between said first and second early decision outputs indicates a difference, then any correction initially made to the processing output based on said first early decision output is undone.

80. The method of claim 79, wherein said first and second early decision outputs are based on memory paths of differing lengths.

81. The method of claim 80, wherein said memory paths of differing lengths are equal to or less than the length of a full memory path.

82. The method of claim 79, wherein,
when the comparison between said first and second early decision outputs indicates a difference and any correction initially made to the processing output based on said first early decision output is undone,
the second early decision output is not used to produce said processing output.

83. The method of claim 79, wherein said processing comprises:
producing a first correction output signal in response to said first early decision output; and
producing a second correction output signal in response to said second early decision output; wherein
said first and second correction output signals produce said processing output.

84. The method of claim 83, wherein the processing further comprises detecting, with a first timing error detector, timing errors between said first correction output signal and an input signal used for said detecting data.

85. The method of claim 84, wherein the processing further comprises detecting, with a second timing error detector, timing errors between said second correction output signal and an input signal used for said detecting data.

86. The method of claim 85, wherein the processing further comprises comparing, with a comparator, said first and second correction output signals.

87. The method of claim 86, wherein the processing further comprises evaluating, with a logic gate, the output of the comparator with a combined output of said first and second timing error detectors to produce a logic gate output.

88. The method of claim 87, wherein the processing further comprises filtering a received input comprising a combination of said logic gate output and the output of the first timing error detector.

89. The method of claim 88, wherein the processing further comprises providing a result of said filtering as said processing output.

90. The method of claim 84, wherein the processing further comprises:
comparing said first and second correction output signals with a comparator; and
selecting a selector output between an output of said comparator and at least one signal related to said first and second correction signals, wherein said processing output is related to said selector output.

91. The method of claim 90, wherein the processing further comprises processing said selector output with a signal related to said first correction output signal to provide said processing output.

92. The method of claim 91, wherein the processing further comprises producing said processing output as an output gain value.

93. The method of claim 92, wherein said second receives a loop gain value and combines said loop gain value with said selector output and said signal related to said first correction output signal to provide said output gain value.

94. The method of claim 93, wherein said selector further selects from a selectable input as a further input; wherein
said comparator output enables selection between said selectable input and said at least one signal related to said first and second correction signals as said selector output.

95. The method of claim 94, further comprising integrating and exponentiating said processing output to produce said output gain value.

96. The method of claim 79, wherein said processing comprises subtracting between said first and second early decision outputs, wherein the result of the subtraction produces said processing output.

97. The method of claim 79, further comprising receiving a loop gain value to produce a gain value output as said processing output.

98. A computer program product comprising a computer-readable medium containing program code for performing a method for driving a decision-driven control loop according to claim 79.

99. The computer program product of claim 98, wherein said first and second early decision outputs are based on memory paths of differing lengths.

100. The computer program product of claim 99, wherein said memory paths of differing lengths are equal to or less than the length of a full memory path.

101. The computer program product of claim 99, wherein said processing comprises:
producing a first correction output signal in response to said first early decision output; and producing a second correction output signal in response to said second early decision output; wherein said first and second correction output signals produce said processing output.

102. The computer program product of claim 101, wherein the processing further comprises detecting, with a first timing error detector, timing errors between said first correction output signal and an input signal used for said detecting data.

103. The computer program product of claim 102, wherein the processing further comprises detecting, with a second timing error detector, timing errors between said second correction output signal and an input signal used for said detecting data.

104. The computer program product of claim 103, wherein the processing further comprises comparing, with a comparator, said first and second correction output signals.

105. The computer program product of claim 104, wherein the processing further comprises evaluating, with a logic gate, the output of the comparator with a combined output of said first and second timing error detectors to produce a logic gate output.

106. The computer program product of claim 105, wherein the processing further comprises filtering a received input comprising a combination of said logic gate output and the output of the first timing error detector.

107. The computer program product of claim 106, wherein the processing further comprises providing a result of said filtering as said processing output.

108. The computer program product of claim 101, wherein the processing further comprises:
 a comparing said first and second correction output signals with a comparator; and
 selecting a selector output between an output of said comparator and at least one signal related to said first and second correction signals, wherein said processing output is related to said selector output.

109. The computer program product of claim 108, wherein the processing further comprises processing said selector output with a signal related to said first correction output signal to provide said processing output.

110. The computer program product of claim 109, wherein the processing further comprises producing said processing output as an output gain value.

111. The computer program product of claim 110, wherein said second receives a loop gain value and combines said loop gain value with said selector output and said signal related to said first correction output signal to provide said output gain value.

112. The computer program product of claim 111, wherein said selector further selects from a selectable input as a further input; wherein
 said comparator output enables selection between said selectable input and said at least one signal related to said first and second correction signals as said selector output.

113. The computer program product of claim 112, further comprising integrating and exponentiating said processing output to produce said output gain value.

114. The computer program product of claim 98, wherein,
 when the comparison between said first and second early decision outputs indicates a difference and any correction initially made to the processing output based on said first early decision output is undone,
 the second early decision output is not used to produce said processing output.

115. The computer program product of claim 98, wherein said processing comprises subtracting between said first and second early decision outputs, wherein the result of the subtraction produces said processing output.

116. The computer program product of claim 98, further comprising receiving a loop gain value to produce a gain value output as said processing output.

* * * * *